United States Patent [19]

Holland et al.

[11] Patent Number: 4,833,407
[45] Date of Patent: May 23, 1989

[54] SCAN TIME REDUCTION USING CONJUGATE SYMMETRY AND RECALLED ECHO

[75] Inventors: G. Neil Holland, Chagrain Falls; Terrence J. Provost, Cleveland Heights; Gordon D. DeMeester, Wickcliffe; Kenneth S. Denison, Shaker Heights, all of Ohio

[73] Assignee: Picker International, Inc., Highland Heights, Ohio

[21] Appl. No.: 124,040

[22] Filed: Nov. 23, 1987

Related U.S. Application Data

[63] Continuation-in-part of Ser. No. 66,039, Jun. 24, 1987, and a continuation-in-part of Ser. No. 85,956, Aug. 14, 1987, Pat. No. 4,780,675.

[51] Int. Cl.$^4$ ............................................. G01R 33/20
[52] U.S. Cl. .................................................. 324/309
[58] Field of Search ................ 324/307, 309, 311, 312

[56] References Cited

U.S. PATENT DOCUMENTS

| | | | |
|---|---|---|---|
| 4,689,567 | 8/1987 | Maudsley | 324/309 |
| 4,694,251 | 9/1987 | Yoshitome et al. | 324/309 |
| 4,728,893 | 3/1988 | Feinberg | 324/309 |
| 4,733,188 | 3/1988 | Sekihara et al. | 324/309 |
| 4,748,410 | 5/1988 | Macovski | 324/309 |

OTHER PUBLICATIONS

"Faster MR Imaging: Imaging with Half the Data" by Margosian, et al., Health Care Instrumentation, vol. 1, No. 6, 1986, pp. 195–197.
"Faster MR Imaging—Imaging with Half the Data" by Paul Margosian, Society of Magnetic Resonance in Medicine, 4th Annula Meeting, Aug. 19–23, 1986, London, pp. 1024–1025.
"Field Inhomogeneity Correction and Data Processing for Spectroscopic Imaging" by Maudsley, et al., Magnetic Resonance in Medicine, 2, 1985, pp. 218–233.
"Direct Fourier Transform NMR Tomography with Modified Kumar-Welti-Ernst (MKWE) Method" by Song, et al., IEEE Transactions on Nuclear Scie nce, vol. NS-29, No. 1, Feb. 1982.
"Magnetic Field Measurement by NMR Imaging" by Maudsley, et al., The Institute of Physics, 1982, pp. 216–220.
"A New Method of Measuring Statis Field Distribution Using Modified Fourier NMR Imaging" by Sekihara, et al., The Institute of Physics, 1985, pp. 224–227.
"MR Images from on Quarter of the Data: Combination of Half Fourier Methods with a Linear Recursive Data Extrapolation" by P. Margosian, Book of Abstracts, Society of Mag. Res. In Medicine, Annual Meeting, Aug. 1987.
"RARE Imaging: A Fast Imaging Method for Clinical MR" by Henning, et al., Mag. Res. in Medicine, 3, pp. 823–833 (1986).
"Phase Encoded, Rapid, Multiple Echo (PERME) Nuclear Magnetic Resonance Imaging" by Lawton, Aug. 1985.
"Exploiting the Stimulated Echo in NMR Imaging" by Sattin, for NVR, Picker Clinical Science Center, vol. 2, No. 1, Feb. 1987, pp. 18–21.

Primary Examiner—Michael J. Tokar
Assistant Examiner—Lawrence G. Fess
Attorney, Agent, or Firm—Fay, Sharpe, Beall, Fagan, Minnich & McKee

[57] ABSTRACT

A spin echo (52) and a gradient echo (60) are generated in each magnetic resonance sequence repetition. The spin echo is phase encoded by a phase encode gradient (44) in regular steps spanning about a quarter of k-space. More particularly, steps from $-n$ to $G_{max}/2$, where n is a small integer and $G_{max}$ is the maximum phase encode gradient. An off-set phase encode gradient (58) shifts the phase encoding of the gradient echo by $G_{max}/2$ relative to the first phase encoding gradient. Data to fill the empty portions of k-space (142, 167) between $-n$ and $-G_{max}$ are generated from the complex conjugate (140, 160), of the first echo data (74) and the second echo data (76). The first and second echo data and the complex conjugate data are transformed (122, 132, 146, 166) to generate parted image representations (124, 134, 148, 168). The first echo image representation and the corresponding conjugately symmetric image representation are phase corrected (126, 150) in accordance with a phase map (112) derived from the central most first echo data (78). The partial image representations are summed (170) to produce a resultant image representation (172).

20 Claims, 3 Drawing Sheets

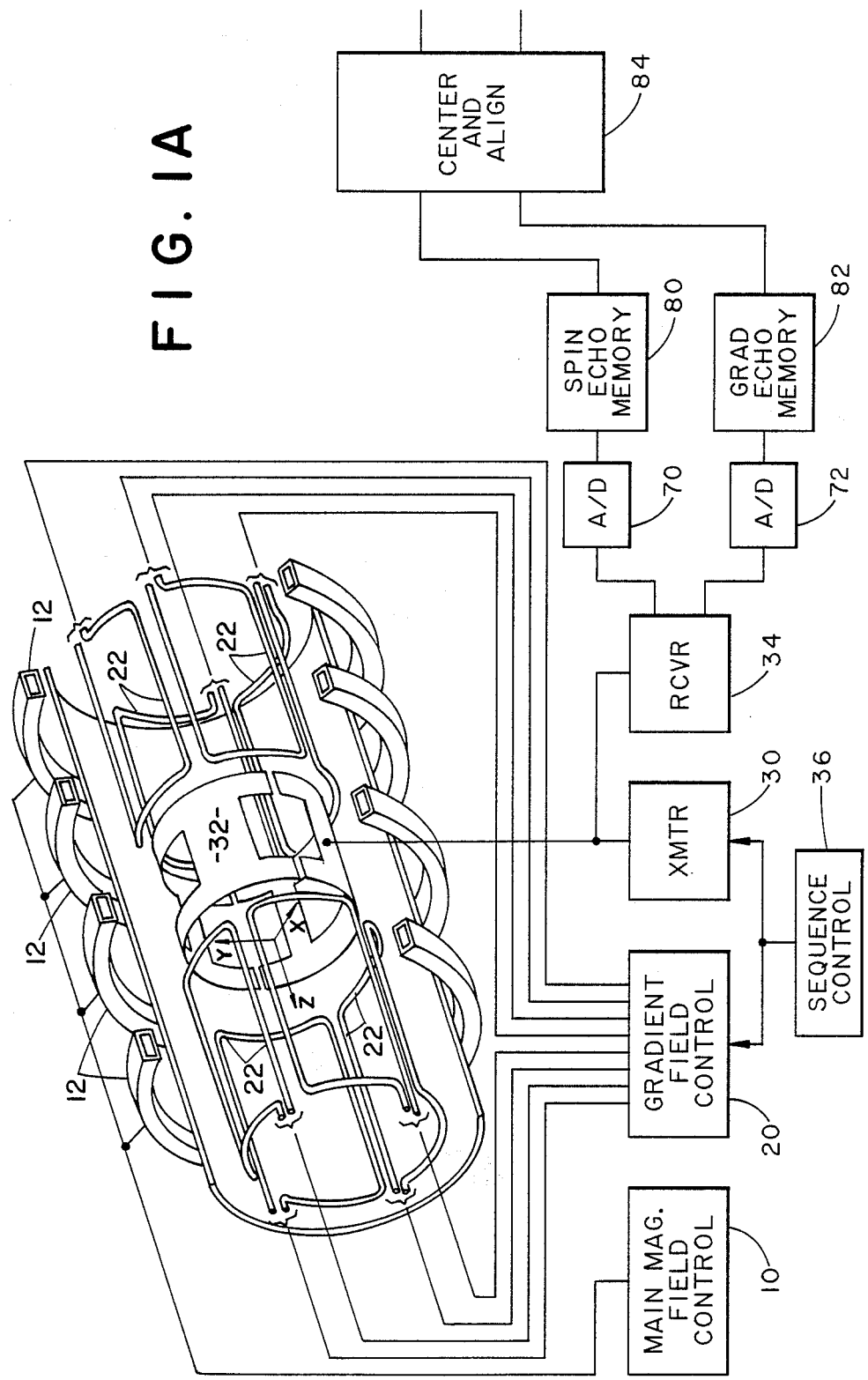

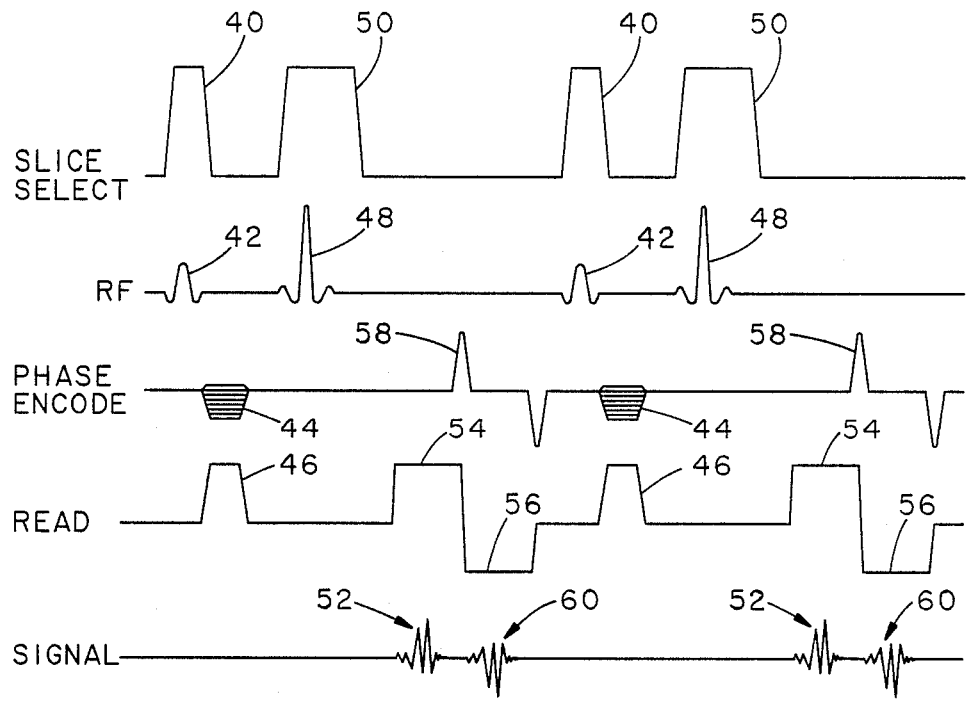
F I G. 2
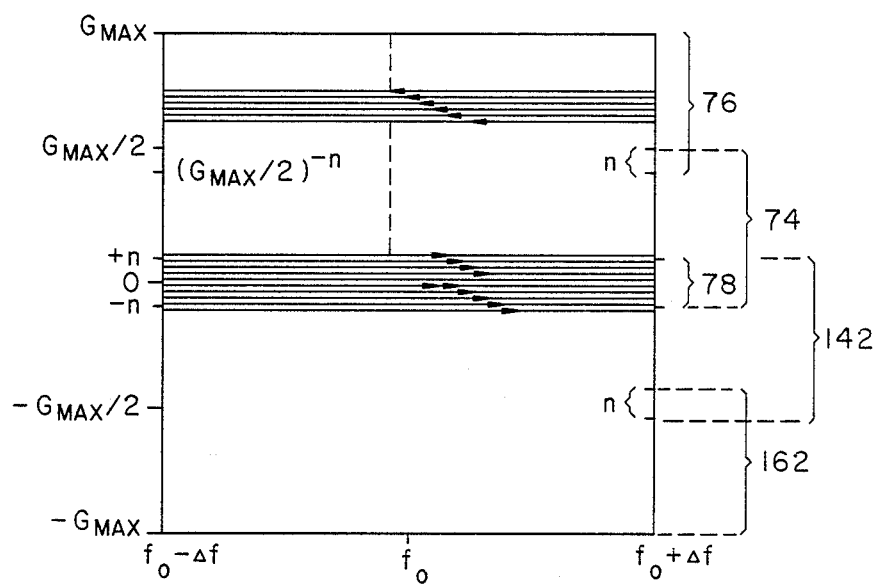
F I G. 3

SCAN TIME REDUCTION USING CONJUGATE SYMMETRY AND RECALLED ECHO

This application is a continuation-in-part of application Ser. Nos. 066,039, filed June 24, 1987 and 085,956, now U.S. Pat. No. 4,780,675 filed Aug. 14, 1987.

BACKGROUND OF THE INVENTION

The present invention relates to the magnetic resonance art. It finds particular application in conjunction with medical diagnostic imaging and will be described with particular reference thereto. It is to be appreciated, however, that the present invention may also find application in other multiple echo imaging and spectroscopy techniques, particularly those in which only a partial or incomplete data set is available.

Heretofore, medical diagnostic magnetic resonance imaging has included the sequential pulsing of radio frequency signals and magnetic field gradients across a region to be imaged. In two dimensional imaging, a patient is disposed in a region of interest in a substantially uniform main magnetic field. An RF excitation pulse is applied concurrently with a slice select gradient to excite resonance in a preselected frequency bandwidth in the selected slice or other region of the patient to be imaged. A phase encode gradient is applied along one of the axes of the selected slice to encode material with a selected phase encoding. In each repetition of the pulse sequence, the phase encode gradient is stepped in regular intervals from a negative maximum phase encode gradient through a zero phase encode gradient to a positive maximum phase encode gradient.

Magnetization manipulation pulses are applied to cause a magnetic resonance echo. During the ensuing echo, one set of data points, generally termed a view or step, is sampled in the presence of a read gradient applied orthogonal to the phase encode gradient across the slice. The complete set of views is operated on by a two dimensional inverse Fourier transform to derive an image representation.

Various techniques have been developed to reduce the data acquisition time. Many of these techniques relate to the use of gradient echo sequences which have very short repeat times. However, images from magnetic resonance data that is T2 weighted, e.g. spin echoes, find the widest diagnostic application. T2 weighted spin echo sequences have a relatively long repeat time, typically two seconds or more.

Theoretically, the pair of views corresponding to like positive and negative phase encode gradients have a symmetric relationship. However, in practice the symmetry relationship is rendered unpredictable by sequence and field dependent phase considerations. In order to overcome these difficulties, conventionally both positive and negative phase encode views are collected forming a phase independent magnitude image.

The data points within each view correspond to a preselected range of frequencies $f_o \pm \delta f$, where $f_o$ is the frequency of the center data value of the view. For the zero phase encoding view, a datum frequency $f_o + f_l$ is symmetrically related to that of $f_o - f_l$. For a real object, the data values for a positive phase encode view corresponding to a frequency of $f_o + f_l$ are also related to the corresponding negative phase encode view at frequency $f_o - f_l$ by conjugate symmetry. In this manner, each data point in a full data set, sometimes referred to as k space, is related to another point by the underlying property of complex conjugate symmetry. Thus, if the symmetry relationship can be rendered predictable, the data acquisition time can be reduced about in half.

Others have reconstructed images utilizing only half a set of views, i.e. only the positive views or only the negative views. In one such half data reconstruction, about eight additional views were collected adjacent the zero or minimum phase encoding. The sixteen central views about the zero phase encoding were utilized to derive a phase map. The acquired data was filtered and the data set was completed by filling with zeroes. The Fourier transform of this data set was then phase corrected by the phase map to yield the final reconstruction. However, this technique produced less than satisfactory images which were particularly sensitive to artifacts caused by motioninduced errors in phase.

The present invention provides a new and improved technique for reducing data acquisition time by about a factor of four.

SUMMARY OF THE INVENTION

In accordance with the present invention, a method and apparatus are provided for magnetic resonance imaging. An imaging sequence is implemented in which a first phase encoded echo is generated concurrently with the application of a read gradient of a first polarity. The phase encoding is changed and a second echo is induced concurrently with a second read gradient of the opposite polarity. This sequence in which two differently phase encoding echoes are produced is repeated with different phase encodings until data collected during the two echoes completes two data sets. The first data set includes a subset or kernel of centrally phase encoded data lines and about a quarter of a complete data set. The second data set includes about another quarter of a complete data set. A phase map is generated from the centrally phase encoded kernel. A third data set which is conjugately symmetric to the first data set and a fourth data set that is conjugated symmetric to the second data set are derived therefrom. The four data sets are Fourier transformed. At least the Fourier transformed first and third data sets are corrected in accordance with the phase map before the four transformed data sets are combined.

In accordance with an apparatus aspect of the invention, means are provided for performing each of the foregoing steps.

One advantage of the present invention is that it reduces the data acquisition time by roughly a factor of four.

Another advantage of the present invention is that it generates images which are T2 weighted.

Still further advantages of the present invention will become apparent to those of ordinary skill in the art upon reading and understanding the following detailed description.

BRIEF DESCRIPTION OF THE DRAWINGS

The invention may take form in various steps and arrangements of steps and in various components and arrangements of components. The drawings are only for purposes of illustrating a preferred embodiment and are not to be construed as limiting the invention.

FIGS. 1A and 1B are two parts of a diagrammatic illustration of a magnetic resonance imaging apparatus in accordance with the present invention;

FIG. 2 illustrates a preferred imaging sequence in accordance with the present invention; and, FIG. 3 is a graphic representation to assist in conceptualizing synthesized additional views by conjugate symmetry.

DETAILED DESCRIPTION OF THE PREFERRED EMBODIMENT

Figure 1B:
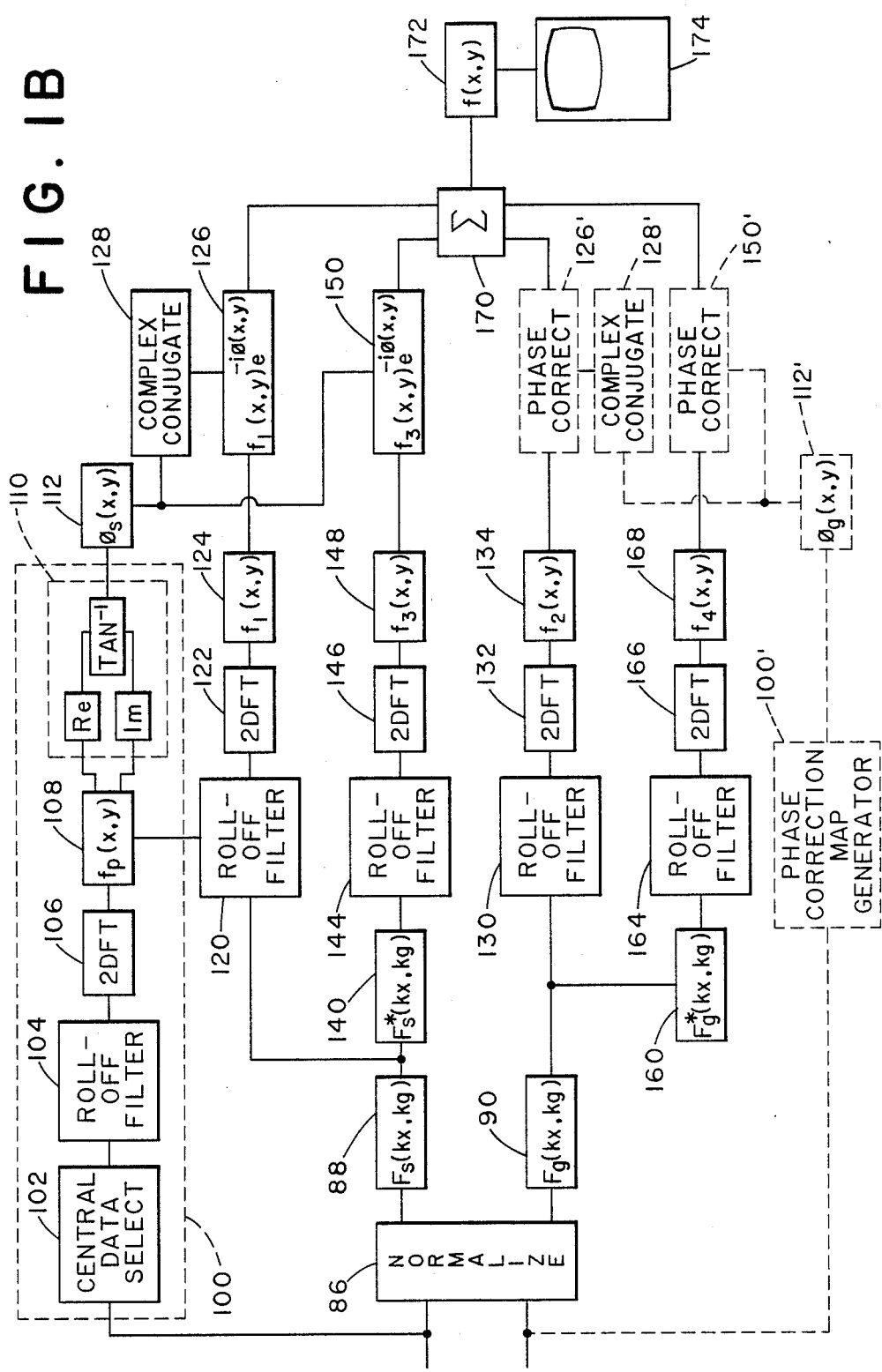

With reference to FIGS. 1A and 1B, a main magnetic field means, including a main magnetic field controller 10 and a plurality of electromagnets 12, generates a substantially uniform, main magnetic field through an image region. With superconducting magnets, the controller 10 is only used to ramp up to field or down. A gradient field control means 20 selectively controls the application of gradient fields across the main magnetic field by gradient field coils 22. By selectively applying current to appropriate gradient field coils, slice select, phase encode, and read gradients are selectively applied along mutually orthogonal axes. The slice select gradients define an image slice or region and the phase encode and read gradients encode the magnetic resonance along mutually orthogonal axes of the slice.

A transmitter 30 selectively applies radio frequency pulses to RF coils 32 to excite nuclear spin of hydrogen in the image region to magnetic resonance and to manipulate or orient the magnetization of the spin. Magnetic resonance signals generated by the resonating dipoles, particularly when the magnetization is refocused into spin and gradient echoes, are received by the RF coils 32. A radio frequency receiver 34 demodulates the received radio frequency signals to a bandwidth of $f_o \pm \delta f$, where the center frequency $f_o$ of the bandwidth or spectrum $\pm \delta f$ is preferably zero.

With reference to FIG. 2, a sequence control means 36 causes the gradient field control 20 to apply a slice select gradient pulse 40 and the transmitter 30 to apply a 90° RF pulse 42 concurrently. Thereafter, a phase encode gradient 44 with one of a plurality of selectable magnitudes between $-G_{max}$ to $+G_{max}$ and a read gradient 46 are applied concurrently. More specifically to the preferred embodiment, the phase encode gradient 44 applies a phase encoding which varies in even steps between $+G_{max}/2$ and $-n$, where n is a small number of gradient steps. In the preferred embodiment, n is 16 steps and $G_{max}/2$ represents at least 64 steps.

A 180° RF refocusing pulse 48 is applied by the transmitter 30 concurrently with the application of a second slice select gradient pulse 50 to induce a spin echo 52. The time interval between the 90° and 180° RF pulses is the same as the interval between the 180° RF pulse and the spi echo 52. A read gradient 54 of a first polarity is applied to encompass the first or spin echo 52. Immediately after the first echo, the polarity of the read gradient is reversed to create a second read gradient 56 with the opposite polarity. As the read gradient is changing, a second phase encode gradient 58 is applied to alter the phase encoding. In the preferred embodiment, the second phase encode gradient increases the phase encoding by $G_{max}/2$. The inversion of the read gradient causes a second or gradient echo 60. The spin echo 52 and the gradient echo 60 occur the same duration to either side of the read gradient polarity change.

With continuing reference to FIGS. 1A and 1B and further reference to FIG. 3, the received magnetic resonance signals are quadrature detected. Specifically, the first, spin echo signal is detected and digitized by an analog-to-digital converter means 70. Analogously, the second or gradient echo signal is detected and digitized by an analog-to-digital converter means 72 to generate a second digital view. Each view is commonly identified by the value of the phase encoding gradient with which the resonance data is encoded.

Each view is frequency encoded by the read gradient pulse and includes a plurality of frequency components. The frequency component in the center of each view should be $f_o$, those at one extreme $f_o + \delta f$ and those at the other extreme $f_o - \delta f$. A data value at a frequency at $f_o + f_l$ of one of the positive phase encode views is related by conjugate symmetry to a datum value at a frequency $f_o - f_l$ of the corresponding negative phase encode view. For the zero phase encode view, the datum values are symmetric about $f_o$.

The imaging sequence is repeated to collect data over a contiguous phase encoded central or first set of views 74 adjacent the zero or minimum phase encode gradient. Data for a second or more strongly phase encoded set of views 76 are acquired for half the remaining views, preferably, the contiguous views between the central views 74 and either $-G_{max}$ or $+G_{max}$. The central views include a centermost subset or kernel 78 of 2n views centered on the zero phase encode view. In the preferred embodiment, the second phase encode gradient pulse 58 causes the data to skip over a quarter of k-space. That is, the first or spin echo views start at a phase encode gradient of -n and extend to about $+G_{max}/2$. The second or gradient echo views extend from $(+G_{max}/2) - n$ to $+G_{max}$. The views between $-n$ and $-G_{max}$ are not generated.

The spin echo data is stored in a first or spin echo view memory means 80 and the second or gradient echo is stored in a second or gradient echo memory means 82. Because the spin and gradient echoes have opposite polarity, the polarity of one of them, presumably the gradient echo, is reversed as it is loaded into the gradient echo memory 82. Reversing the polarity includes loading each view in the opposite direction.

A centering and aligning means 84 centers the data in the spin echo and gradient echo memories. For spin echo and gradient echoes, the magnitude of the acquired data is a maximum at the center of the data set, i.e. the datum value acquired with the zero or minimum phase encoding angle and with the zero or $f_o$ characteristic frequency. The data within the spin echo memory is examined to find the peak value. The data is shifted such that the peak value is moved to the memory coordinate corresponding to zero phase angle and the $f_o$ frequency. This may involve shifting data lines up or down, left or right. Any data lines or portion of data lines for which there is no data are filled with zeroes. The gradient echo data is centered by comparing the overlapping gradient and spin echo data lines. The gradient echo data is shifted to bring corresponding spin and gradient echo data in the region $(G_{max}/2) - n$ to $G_{max}/2$ into alignment.

A normalizing means 86 normalizes the data from the spin and gradient echoes. That is, the amplitudes of one or both are adjusted to bring the magnitudes into conformity. The magnitudes may be adjusted by taking the square root of the square of the real and imaginary parts of the data values from the first and second echo memories in the region in which they overlap, i.e. the region between $G_{max}/2$ and $(G_{max}/2) - n$. The average magnitude of each data set in this region is determined and the ratio of these magnitudes utilized to adjust one of the data sets up or down. The centered and normalized spin echo and gradient echo data sets $F_s(k_x, k_y)$ and $F_g(k_x,$ $k_y$) are stored in normalized spin echo and gradient echo data memory means 88 and 90, respectively.

A phase map reconstructing means 100 reconstructs a phase map $\phi(x,y)$ from the centermost data portion or kernel 78. More specifically, a central data selecting means 102 selects the largest available matrix of data which is centered on the zero phase encode view, e.g. a 2n by 256 data matrix centered at (0,0). The remainder of the data values, such as the remainder of a 256×256 array are loaded with zeroes. A roll off filter means 104 rolls-off the data values of the selected centermost matrix smoothly to the loaded zeroes. Various roll-off filters may be utilized such as a Hanning filter, a Hamming filter, or the like. The roll-off filter provides a smooth transition from the actually collected data to the surrounding zeroes to eliminate any discontinuities which might cause ringing or artifacts. A two dimensional Fourier transform means 106 performs an inverse Fourier transform on the filtered data to construct a phase map, e.g. a 256×256 array of complex data values $f_p(x,y)$. The phase map may be either the complex number phase of the resultant complex image or the complex image, each element of which is normalized to a magnitude of 1.0. A phase determining means 110 determines the phase of each of the complex data values of the 256×256 matrix for storage in a phase memory 112, such as a 256×256 memory. The values for the phase memory 112 may be determined by calculating the arctangent of the real and imaginary parts of each data value. Alternately, the phase determining means may normalize each complex data value such that it becomes a vector of unit length which is stored in the phase memory means 112.

The actually collected first or spin echo data $F_s(k_x,k_y)$ from the normalized spin echo memory 88 is filtered with a roll-off filter 120, such as a Hamming filter. The filter smoothly ramps the actually collected data down to the loaded zeroes. The roll-off filter operates between views −n and 0 and between views $G_{max}/2$ and $(G_{max}/2)-n$. The filtered data is inverse Fourier transformed by a two dimensional Fourier transform means 122 to form a first image representation $f_1(x,y)$ which is stored in a first image representation memory means 124. A first phase correction means 126 phase corrects the first image representation in accordance with the phase information in phase memory means 112. More specifically, a phase correction complex conjugate means 128 calculates the complex conjugate of each value in the phase memory means 112. For example, the complex conjugate of the unit vector $e^{i\phi}(x,y)$ is $e^{-i\phi}(x,y)$. The phase correction means 126 multiplies each (x,y) value of the first image representation by the complex conjugate of the value in the phase memory means 112 for the corresponding (x,y) position. In the preferred embodiment, the corrected image representation is of the form:

$$F_1(x,y)e^{-i\phi(x,y)}$$

A roll-off filter means 130 smooths the transition between the actually collected gradient echo data $F_g(k_x,k_y)$ and the loaded zeroes across the $(G_{max}/2)-n$ to $G_{max}/2$ region. The roll-off filter 130 is the complement of a roll-off filter 120. A Fourier transform means 132 performs an inverse two dimensional Fourier transform on the filtered gradient echo data to create a second image representation $f_2(x,y)$ for storage in a second image representation memory means 134.

A spin echo complex conjugate means 140 generates a first or spin echo complex conjugate data set $F_s^*(k_x,k_y)$ for each data value in a region 142 (FIG. 3) with phase encode gradients from the zero to $-G_{max}/2$, i.e. the complex conjugate of the first data set 74. A filter means 144 ramps up the symmetrized data views from 0 to −n at a rate which is the complement of the filter 120 and ramps the symmetrized data down between views $(-G_{max}/2)+n$ and $-G_{max}/2$ at the same rate as filter 120. A Fourier transform means 146 performs an inverse, two dimensional Fourier transform on the complex conjugate data to create a third image representation $f_3(x,y)$ for storage in a third image representation memory 148. A second phase correction means 150 corrects each data value of the third image representation in accordance with the phase of the corresponding (x,y) address of the phase memory 112. In the preferred embodiment, the third phase corrected image representation is of the form:

$$f_3(x,y)e^{i\phi(x,y)}$$

A gradient echo complex conjugate means 160 generates a gradient echo complex conjugate data set $F_g^*(k_x,k_y)$. From the complex symmetry relationship, each data value in a region 162 (FIG. 3) with phase encode gradients from $(-G_{max}/2)-n$ is generated, i.e. the complex conjugate of the second data set 76. A roll-off filter means 164 ramps down the symmetrized data in views $-G_{max}/2$ to $(-G_{max}/2)-n$ with a roll-off filter function that is the complement of filter function 144. A Fourier transform means 166 performs an inverse, two dimensional Fourier transform on the complex conjugate data to create a fourth image representation $f_4(x,y)$ for storage in a fourth image representation memory means 168.

A summing means 170 sums the first, second, third, and fourth image representations into a resultant or composite image representation f(x,y) for storage in a resultant image memory 172. The resultant image may be displayed on a video monitor 174 subject to further processing, stored on tape or disc, or the like.

Alternately, a calibration scan of 2n views can be collected. More specifically, the 2n views of the spin echo adjacent the zero phase encode view are collected. The quarter k-space phase encode shift gradient 58 is applied such that the 2n views of the gradient echo adjacent $G_{max}/2$ are collected. This data is used as described above to determine the offset required to center and the ratio required to normalize the spin echo and gradient echo data sets. The central spin echo phase encoded data is also utilized by the phase correction determining means 100 to generate the phase map stored in phase memory 112. The centering, normalizing, and phase map from the 2n views are utilized in subsequent scans.

The spin echo based image representations are phase corrected. However, the gradient echo based images, are not phase corrected in the above described embodiment. Optionally, the third and fourth image representations can be phase corrected in accordance with the phase correction from phase memory 112.

Where accurate phase correction of the gradient echo data is necessary, it is preferred that phase correction data be acquired in a separate, preliminary scan. That is, the central most 2n views between ±n are collected for both the spin echo and the gradient echo. The views are centered by the centering means 84 and the empty pixel values filled with zeroes. The phase correction determining means 100 determines appropriate phase corrections φ(x,y) for the spin echo data and stores it in phase correction memory 112. An analogous phase correction determining means 100' of the same construction as the spin echo phase map determining means 100 determines the phase map for the gradient echo data. The gradient echo phase map is stored in a phase memory means 112' and a complex conjugate means 128'. A phase correction means 126' may be provided for phase correcting the third image representation. Analogously, a phase correction means 150' may be provided for phase correcting the fourth image representation. The phase correction data stored in phase memories 112 and 112' is fixed during the initial scan of 2n views and is used unchanged through subsequent scans.

The invention has been described with reference to the preferred embodiments. Obviously, modifications and alterations will occur to others upon reading and understanding the preceding detailed description. It is intended that the invention be construed as including all such alterations and modifications insofar as they come within the scope of the appended claims or the equivalents thereof.

Having thus describbed the preferred embodiment, the invention is now claimed to be:

1. A method of magnetic resonance imaging comprising:
   (a) exciting magnetic resonance;
   (b) phase encoding the magnetic resonance;
   (c) inducing an echo;
   (d) applying a read gradient pulse of a first polarity during the first echo and acquiring a first echo view;
   (e) changing the phase encoding;
   (f) applying a read gradient pulse of a second polarity to induce at least a second echo;
   (g) acquiring a second echo view during the second echo;
   (h) repeating steps (a) through (g) with different phase encodings until a set of views neighboring a centrally phase encoded view and half of the remaining phase encodable views are acquired;
   (i) generating a phase map from the views neighboring the centrally phase encoded view;
   (j) generating complex conjugately symmetric views from the acquired views;
   (k) Fourier transforming the first echo, second echo, and conjugately symmetric views;
   (l) phase correcting at least some of the Fourier transformed views in accordance with the phase map;
   (m) combining the Fourier transformed views to produce an image representation.

2. The method as set forth in claim 1 wherein the first echo is a spin echo.

3. The method as set forth in claim 1 wherein the second echo is a gradient echo.

4. The method as set forth in claim 1 wherein the first echo views are phase encoded with phase encoding gradients from neighboring zero phase encode to about one half of maximum phase encode and wherein in step (e) the phase encoding is changed by one half the maximum phase encoding, whereby redundant first and second echo views are acquired adjacent one half the maximum gradient.

5. The method as set forth in claim 4 further including aligning and normalizing the first and second echo views.

6. The method as set forth in claim 4 wherein the phase correcting step is performed on the Fourier transformed first echo and first echo conjugately symmetric views.

7. A method of magnetic resonance imaging comprising:
   (a) exciting magnetic resonance;
   (b) inducing a first echo responsive to said resonance excitation with a first phase encoding;
   (c) inducing a plurality of subsequent echoes also responsive to said resonance excitation each with other phase encodings;
   (d) sampling the first echo to acquire a first view and sampling each subsequent echo to acquire subsequent views;
   (e) repeating steps (a) through (d) with a plurality of phase encodings until views which span about a half of k-space are acquired;
   (f) generating complex conjugate views which span about half of k-space from the acquired first and subsequent views;
   (g) creating an image representation from the first, subsequent, and complex conjugate views.

8. The method as set forth in claim 7 further including phase correcting at least portions of the image representation corresponding to a central portion of k-space.

9. The method as set forth in claim 8 wherein the phase correction is done in accordance with a phase map generated from first echo views phase encoded with phase encodings neighboring a center of k-space.

10. A method of magnetic resonance imaging comprising:
    (a) exciting magnetic resonance;
    (b) inducing a first echo with a first phase encoding;
    (c) after inducing the first echo, changing the phase encoding by a phase encoding that corresponds to about one quarter of k-space;
    (d) inducing a second echo with the changed phase encoding;
    (e) sampling the first echo to acquire a first view and the second echo to acquire a second view;
    (f) repeating steps (a) through (e) with a plurality of phase encodings until views which span about a half of k-space are acquired;
    (g) generating complex conjugate views which span about half of k-space from the acquired first and second views;
    (h) creating an image representation from the first, second, and complex conjugate views.

11. A method of magnetic resonance imaging comprising:
    (a) exciting magnetic resonance;
    (b) inducing a spin echo with a first phase encoding;
    (c) inducing a gradient echo with a second phase encoding;
    (d) sampling the spin echo to acquire a first view and the gradient echo to acquire a second view;
    (e) repeating steps (a) through (d) with a plurality of phase encodings until views which span about a half of k-space are acquired;
    (f) generating complex conjugate views which span about half of k-space from the acquired first and second views;
    (g) creating an image representation from the first, second, and complex conjugate views.

12. The method as set forth in claim 11 wherein a first polarity read gradient is applied concurrently with the spin echo and wherein the gradient echo is induced by reversing the polarity of the read gradient to cause an opposite polarity read gradient concurrently with the gradient echo.

13. The method as set forth in claim 12 wherein the spin echoes are phase encoded with phase encoding gradients in steps from n steps on one side of the zero phase encode gradient half way to a maximum phase encode gradient on the other side of the zero phase encode gradient and wherein the gradient echo is phase encoded in steps from half the maximum phase encode gradient minus n to the maximum phase encode gradient, where n is an integer.

14. The method as set forth in claim 13 further including filtering the spin and gradient echo views corresponding to the steps between half the maximum phase encode gradient and half the minus phase encode gradient minus n with complementary roll-off filters.

15. A method of magnetic resonance imaging comprising:
   collecting first echo views representing about a first quarter of k-space adjacent a zero phase encoding;
   collecting second echo views whose phase encode is shifted from the first echo views by a first fraction of k-space;
   generating complex conjugate views to the first echo views;
   generating complex conjugate views to the second echo views;
   Fourier transforming the first echo views, the second echo views, the complex conjugate first echo views, and the complex conjugate second echo views to generate an image representation; and,
   adjusting a phase of at least the transformed first echo and first echo complex conjugate views.

16. The method as set forth in claim 15 wherein the first echo views are phase encoded in regular steps from n steps to one side of a zero phase encode gradient to about half way to a maximum phase encode gradient on the other side of zero phase encode and wherein the second echo is phase encoded in even steps from n steps below half the maximum phase encode gradient to the maximum phase encode gradient.

17. The method as set forth in claim 15 wherein the first echo is a spin echo and the second echo is a gradient echo.

18. The method as set forth in claim 15 wherein the phase encoding step includes deriving a phase map from the views encoded in 2n steps most closely adjacent the zero phase encode gradient.

19. An apparatus for magnetic resonance imaging:
   a main magnetic field means for inducing a generally linear main magnetic field through an image region;
   a radio frequency transmitting means for transmitting radio frequency pulses into the image region for selectively inducing magnetic resonance and for selectively causing the formation of magnetic resonance echoes;
   a gradient field means for causing magnetic field gradients across the image region, the magnetic field gradients including read gradients, first phase encode gradients applied before a first echo and varying in regular steps, and second phase encode gradients applied before a second echo formed responsive to the same resonance inducing rf pulse as the first echo and providing a preselected phase encode offset, the first and second phase encode gradients being applied in a common direction and at different times;
   a receiving means for receiving magnetic resonance signals from the image region and producing corresponding views;
   a first echo image memory means for storing views received during a first echo in each sequence;
   a second echo image memory means for storing views received during a second echo in each sequence;
   an aligning means for aligning views in the first and second echo memories;
   a conjugate symmetry means for generating conjugate symmetry views which are conjugately symmetric to the first echo views and the second echo views; and,
   a transform means for transforming the first echo, the second echo, and the conjugately symmetric views into image representations.

20. The apparatus as set forth in claim 19 further including:
   a phase determining means for determining appropriate phase correction from at least the first echo views; and,
   a phase correction means for correcting the first echo views and the conjugately symmetric views corresponding to the first echo views in accordance with the determined phase correction.

* * * * *